(12) United States Patent
Stevenson et al.

(10) Patent No.: US 8,525,149 B2
(45) Date of Patent: Sep. 3, 2013

(54) PHOTON SOURCE FOR PRODUCING ENTANGLED PHOTONS

(75) Inventors: Richard Mark Stevenson, Cambridge (GB); Andrew James Shields, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 372 days.

(21) Appl. No.: 12/903,524

(22) Filed: Oct. 13, 2010

(65) Prior Publication Data
US 2011/0108744 A1 May 12, 2011

(30) Foreign Application Priority Data
Nov. 6, 2009 (GB) .................................. 0919534.8

(51) Int. Cl.
*H01L 33/06* (2010.01)

(52) U.S. Cl.
CPC ...................................... *H01L 33/06* (2013.01)
USPC .................. 257/13; 257/14; 257/25; 250/251

(58) Field of Classification Search
None
See application file for complete search history.

(56) References Cited

U.S. PATENT DOCUMENTS

| | | | |
|---|---|---|---|
| 6,728,281 B1 * | 4/2004 | Santori et al. | 372/45.01 |
| 8,227,830 B2 * | 7/2012 | Bennett et al. | 257/103 |
| 2002/0196827 A1 | 12/2002 | Shields et al. | |
| 2005/0025200 A1 | 2/2005 | Santori et al. | |
| 2010/0232279 A1 | 9/2010 | Stevenson et al. | |

FOREIGN PATENT DOCUMENTS

| | | |
|---|---|---|
| GB | 2 386 470 A | 9/2003 |
| GB | 2 440 850 A | 2/2008 |
| GB | 2 443 220 A | 4/2008 |
| GB | 2 451 803 A | 2/2009 |

OTHER PUBLICATIONS

R. M. Stevenson, et al., "A semiconductor source of triggered entangled photon pairs", Nature, vol. 439, Jan. 2006, pp. 179-182.
Jia-Lin Zhu, et al., "Effective tuning of exciton polarization splitting in coupled quantum dots", Applied Physics Letters, vol. 90, 261119, 2007, 3 pages.
Zhiliang Yuan, et al., "Electrically Driven Single-Photon Source", Science, vol. 295, Jan. 4, 2002, pp. 102-105.
Combined Search and Examination Report issued Mar. 22, 2010 in United Kingdom Application No. GB0919534.8.
International Search Report and Written Opinion issued Feb. 8, 2011, in PCT/GB2010/002039.
Oliver Benson, et al., "Regulated and Entangled Photons from a single Quantum Dot", Physical Review Letters, vol. 84, No. 11, XP-002599807, Mar. 13, 2000, pp. 2513-2516.

(Continued)

*Primary Examiner* — Jack Berman
(74) *Attorney, Agent, or Firm* — Oblon, Spivak, McClelland, Maier & Neustadt, L.L.P.

(57) ABSTRACT

A photon source comprising: a quantum dot; electrical contacts configured to apply an electric field across said quantum dot: and an electrical source coupled to said contacts, said electrical source being configured to apply a potential such that carriers are supplied to said quantum dot to form a bi-exciton or higher order exciton, wherein said photon source further comprises a barrier configured to increase the time which a carrier takes to tunnel to and from said quantum dot to be greater than the radiative lifetime of an exciton in the quantum dot, the quantum dot being suitable for emission of entangled photons during decay of a bi-exciton or higher order exciton.

19 Claims, 15 Drawing Sheets

(56) References Cited

OTHER PUBLICATIONS

Dieter Bimberg, et al., "Quantum Dots for Single- and Entangled-Photon Emitters", IEEE Photonics Journal, vol. 1, No. 1, XP-011269618, Jun. 1, 2009, pp. 58-68.

R. Hafenbrak, et al., "Triggered Polarization-entangled photon pairs from a single quantum dot up to 30 K" New Journal of Physics, vol. 9, No. 9, XP-020122894, Sep. 1, 2007, 10 pages.

R. J. Young, et al., "Entangled photons from the biexciton cascade of quantum dots", Journal of Applied Physics, vol. 101, No. 8, XP-012098288, Apr. 27, 2007, pp. 081711-1 to 081711-4.

R. M. Stevenson, et al., "Time-evolving entanglement and violation of Bell inequalities using a quantum dot photon-pair emitter", Lasers and Electro-Optics 2009 and the European Quantum Electronics Conference, XP-031503498, Jun. 14, 2009, 1 page.

* cited by examiner

PHOTON SOURCE FOR PRODUCING ENTANGLED PHOTONS

CROSS-REFERENCE TO RELATED APPLICATION(S)

This application is based upon and claims the benefit of priority from UK Patent Application No. 0919534.8 filed Nov. 6, 2009; the entire contents of which are incorporated herein by reference.

FIELD

Embodiments described herein generally relate to the field of photon sources. More particularly, the photon sources which can produce entangled photon pairs.

BACKGROUND

Entangled photon sources have applications in many fields such as quantum communication, quantum computing and high resolution imaging. Entangled photons can be produced using parametric down conversion with optical non-linear crystals. However, there is a commercial need to be able to produce such a photon source using standard semiconductor materials due to its ease of integration with other components.

Recently, there has been work performed on attempting to generate entangled photon states using bi-exciton decay in quantum dots.

In order to produce entanglement it is necessary to produce a stable neutral bi-exciton which decays to a stable neutral exciton.

BRIEF DESCRIPTION OF THE DRAWINGS

The present invention will now be described with reference to the following non-limiting embodiments in which:

FIG. 5b has a InAs quantum dot with a thick 1λ GaAs provided on one side of the quantum dot; FIG. 5c has a InAs quantum dot with an AlGaAs barrier provided on one side of the quantum dot; and FIG. 5d has an InAs quantum dot and two higher AlGaAs barriers provided on either side of the quantum dot;

FIGS. 6(a), 6(b) and 6(c) are plots of the second order cross correlation of the emission as a function of the delay between photons, measured in the rectilinear, diagonal and circular bases respectively, for photon pairs of identical (black) or opposite (dashed) polarisation; FIG. 6(d) shows the fidelity of the measured photon pairs to the maximally entangled state $(|HH\rangle + |VV\rangle)/\sqrt{2}$, as a function of the delay between photons;

FIGS. 7(a), 7(b) and 7(c) show the degree of polarisation correlation as a function of the number of periods between photons, measured in the rectilinear, diagonal and circular bases respectively, FIG. 7(d) shows the corresponding fidelity of the measured photon pairs to the maximally entangled state $(|HH\rangle + |VV\rangle)/\sqrt{2}$;

DETAILED DESCRIPTION

Figure 2:
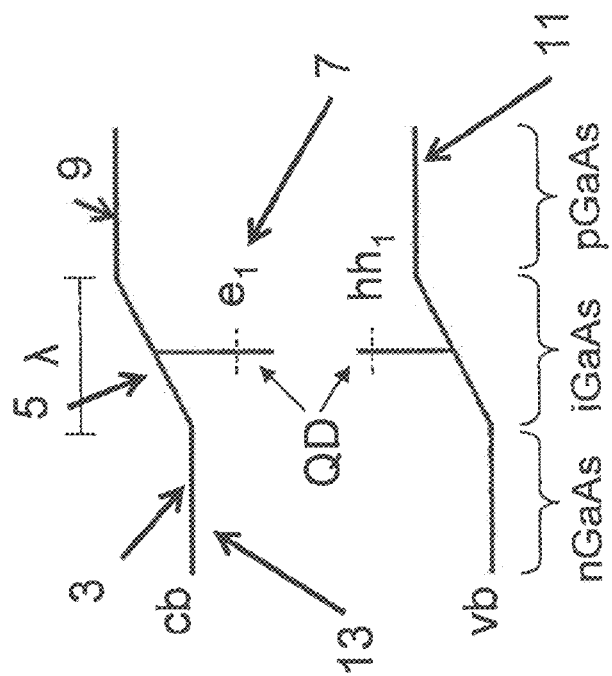
FIG. 2 is a schematic of the band diagram of the LED of FIG. 1.

In an embodiment a photon source is provided comprising: a quantum dot; electrical contacts configured to apply an electric field across said quantum dot; and an electrical source coupled to said contacts, said electrical source being configured to apply a potential such that carriers are supplied to said quantum dot to form a bi-exciton or higher order exciton, wherein said photon source further comprises a barrier configured to increase the time which a carrier takes to tunnel to or from said quantum dot to be greater than the radiative lifetime of an exciton in the quantum dot, the quantum dot being suitable for emission of entangled photons during decay of a bi-exciton or higher order exciton.

For the avoidance of doubt, the term "barrier" is used to mean a material system which has a higher bandgap than that of said quantum dot.

The barrier will generally be provided as a layer between the quantum dot and the electrical contact. The thickness of said layer will be preferably at least 150 nm.

In an embodiment, the photon source has a p-i-n structure, with said quantum dot provided in the intrinsic (i) region between the p and n regions.

As the tunneling time for electrons is usually much shorter than holes due to their lower effective mass, the barrier may be provided just to increase the tunneling time of electrons. Thus, the barrier may be provided between an n-type contact and the quantum dot.

The quantum dot may be an InAs quantum dot and said barrier material may be GaAs. However, the barrier material may also comprise a higher band-gap material such as AlGaAs. Due to the higher band-gap of AlGaAs, an AlGaAs barrier would not need to be as thick as a GaAs barrier in order to provide the same level of resilience to tunneling. However, a lower band-gap barrier material such as GaAs is preferred since such a material will require lower operating potentials across the photon source.

Photon pairs emitted by quantum dots are typically entangled in a time-evolving state, to reduce the time evolving component of the state, the energy difference between the optically active exciton levels of different polarisations in the quantum dot, or "splitting" needs to be minimised. Therefore, preferably the splitting of the energy levels is equal to or less than the homogenous line-width of the emission from the quantum dot. A dot with these characteristics has a degenerate energy level. For typical InAs quantum dots, the exciton radiative lifetime is ~1 ns. Quantitatively, the splitting should be equal to or less than 2 µeV, more preferably equal to or less than 1 µeV.

There are many methods of producing a quantum dot with the above desirable spitting. A small to minimal splitting is naturally occurring in some dots, especially dots which emit photons at an energy of approximately 1.4 eV. Therefore a dot may be selected to have the above properties.

The "splitting" in a quantum dot may also be reduced after fabrication of the dot. For example, the photon source may be subjected to annealing after growth to reduce the splitting of the quantum dot. In a further embodiment, the quantum dot is subjected to a further field to reduce the splitting. The field may be selected from a magnetic field, an electric field or a strain field.

In an embodiment the photon source is used as an entangled photon source and more specifically an entangled light emitting diode. The source is suitable for use in quantum communication systems, for quantum imaging, in quantum data storage and reading and in quantum computing for these and other uses the source will preferably further comprise a distribution unit to reproducibly distribute each entangled photon pair across two output channels.

In a first configuration, said distribution unit may be configured to separate said photons on the basis of their energy or time emitted from source, and output said photons.

In a second configuration, said distribution unit is configured to divide the wavefunctions of an entangled pair of photons. A distribution unit so configured may comprise a polarising beam splitter. The photons which form the entangled pair may be outputted on a quantum mechanical superposition of output channels.

Said distribution unit may be further configured to entangle said entangled photons with respect to a further property, said further properties being selected from path entanglement or phase entanglement.

Some uses of entangled photon pairs use the property that measurement of an entangled state of one of the photons will affect the other photon of the pair. This property is utilised in quantum communication systems. In systems which use this property a separate detector is required for each photon of the pair. Thus, in one embodiment the source further comprises a separate detector for each photon of the pair.

Other uses of entangled photon pairs, such as in quantum imaging, rely on the reduced wavelength of the entangled pair. For such uses, a single detector may be provided which can distinguish between the arrival of a single photon and an entangled photon pair.

In use, the photon source may be operated by holding the source at a fixed DC bias. However, in one mode of operation the bias across the device is pulsed such that the electrical source is configured to switch between two voltages, a first voltage being configured to allow injection of carriers into said quantum dot and a second voltage wherein said carrier injection is stopped.

At the first voltage the source will be forward biased above the threshold for current flow, to inject electrons and holes into the dot in order that they can recombine radiatively to emit a photon pair. The actual value of a voltage depends on the diode design, material, leakage paths and contact resistance. The current should be sufficient so that at least one electron and hole are captured by the dot in a time period equivalent to the exciton radiative lifetime.

In an embodiment, the second voltage is set to minimise tunneling of carriers from the contacts to the quantum dot.

In a further embodiment a method of operating a photon source is provided, said photon source comprising: a quantum dot; electrical contacts configured to apply an electric field across said quantum dot; and an electrical source coupled to said contacts, said electrical source being configured to apply a potential such that carriers are supplied to said quantum dot to form a bi-exciton or higher order exciton, wherein said photon source further comprises a barrier configured to increase the time which a carrier takes to tunnel to and from said quantum dot to be greater than the radiative lifetime of an exciton in the quantum dot, the quantum dot being suitable for emission of entangled photons during decay of a bi-exciton or higher order exciton; said method comprising: switching said electrical source between two voltages, a first voltage being configured to allow injection of carriers into said quantum dot and a second voltage wherein said carrier injection is stopped and tunneling of carriers to and from the quantum dot is minimised.

In a yet further embodiment a method of fabricating a photon source is provided; said method comprising: forming an n-type semiconductor region; forming a p-type semiconductor region; forming a quantum dot in a semiconductor structure between said n and p-type semiconductor regions; forming a barrier between said n-type region and said quantum dot, said barrier being configured to increase the time which an electron takes to tunnel to and from said quantum dot to be greater than the radiative lifetime of an exciton formed in the quantum dot, wherein said quantum dot is configured to be suitable for emission of entangled photons during decay of a bi-exciton or higher order exciton, the method comprising providing electrical contacts to said n and p-type semiconductor region.

In an embodiment, configuring said quantum dot comprises selecting growth parameters of said quantum dot to provide a dot with a degenerate exciton energy level.

In a further embodiment, configuring said quantum dot comprises annealing said quantum dot after formation of said quantum dot to provide a dot with a degenerate exciton energy level.

In a yet further embodiment, configuring said quantum dot comprises subjecting said quantum dot to a field, said field being selected from a strain field a magnetic field or an electric field. A strain field could be applied for example by bonding the device to a piezo-electric transducer and applying a voltage to said transducer, which in turn would apply a strain field across the device. A magnetic field could be applied by passing current through a conducting or superconducting coil near the device, or by presence of one or more permanent magnets.

Figure 1:
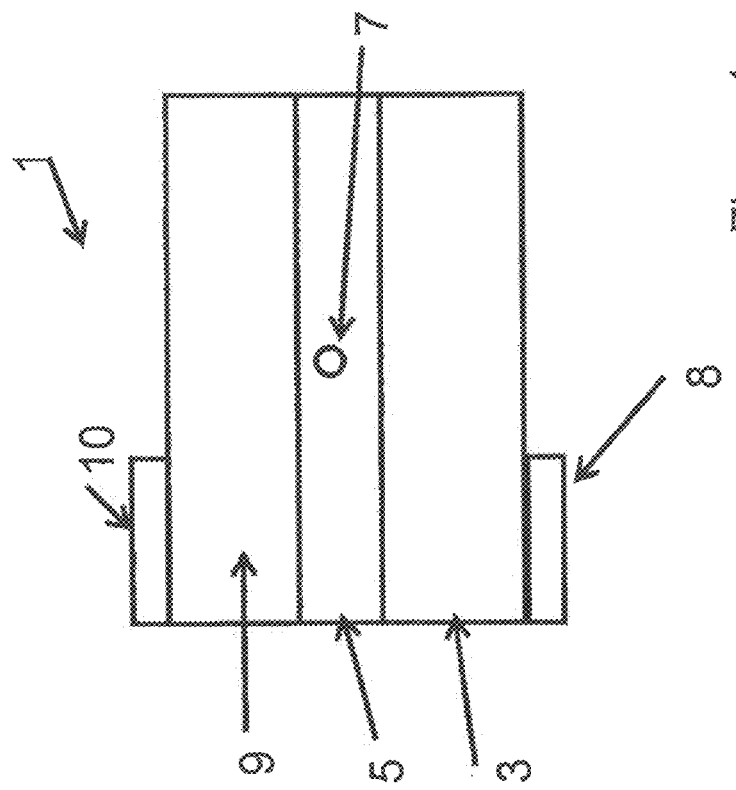
FIG. 1 is a schematic of an LED with a quantum dot useful for understanding the present invention.

FIG. 1 shows a simplified photon source 1 with a quantum dot which is useful for understanding the present invention, the photon source has a lower n-type region 3, provided overlying and in contact with said n-type region 3 is an intrinsic active region 5. Quantum dot 7 is provided in said active region 5. An upper p-type region 9 is provided overlying an in contact with said active region 5.

FIG. 2 is a band diagram of the structure of FIG. 1, to avoid unnecessary repetition, like reference numerals have been used to denote like features. In FIG. 2, an InAs quantum dot 7 is provided in intrinsic region 5 which comprises iGaAs. The lower n-doped region 3 comprises n-doped GaAs and the upper p-doped region 9 comprises p-doped GaAs. The intrinsic region 5 has a total thickness (measured in the direction perpendicular to the plane of the regions) which is approximately equal to the wavelength of photons emitted from the quantum dot 7.

In use, electrons are supplied to the conduction band 13 of the quantum dot 7 and holes to the valence band 11 of the quantum dot 7 to form an exciton. After an average time known as the radiative decay time or lifetime, the exciton decays to output a photon.

Figure 3:
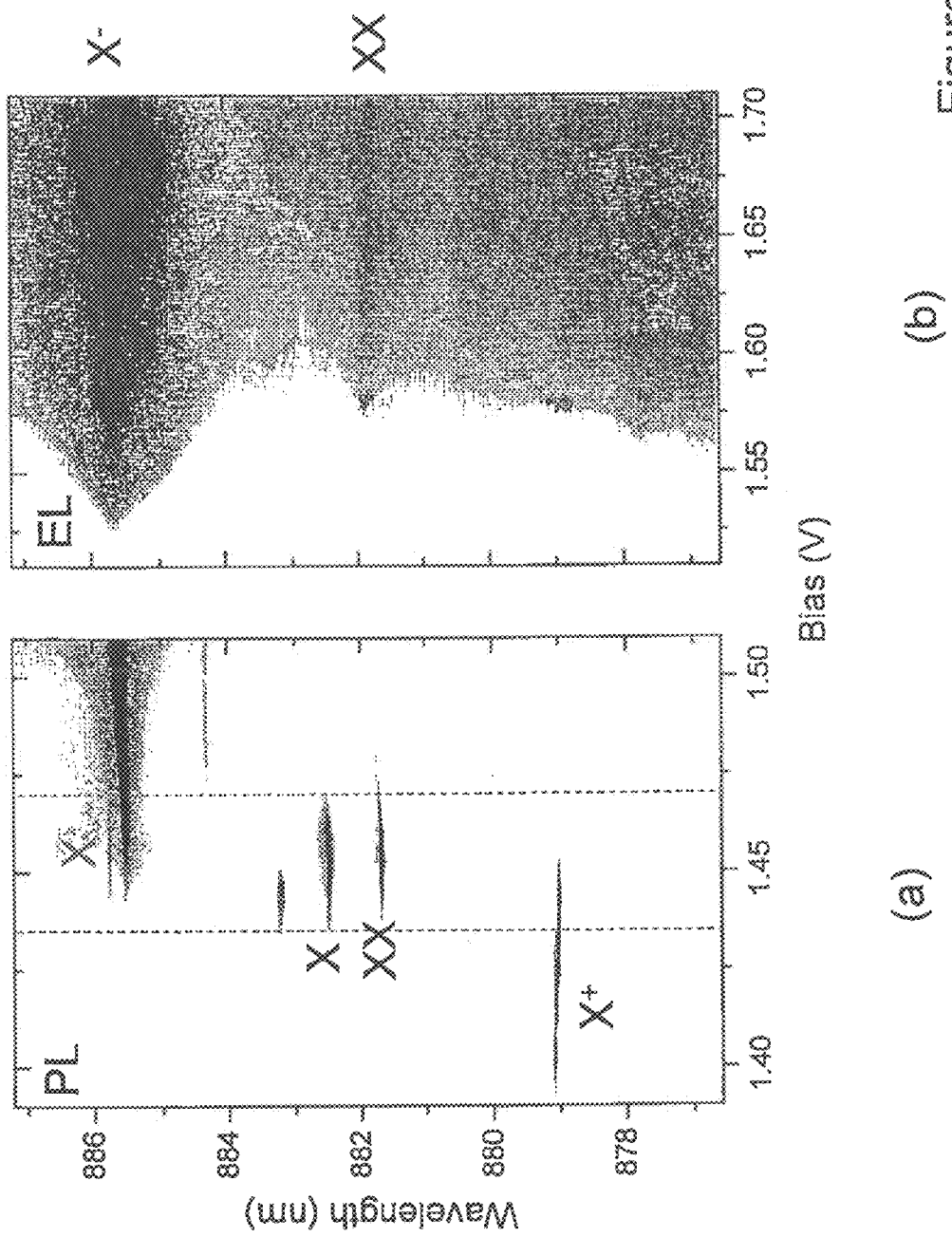
FIG. 3(a) is a grayscale plot of the photoluminescence of a photon source of the type described with reference to FIGS. 1 and 2, useful for understanding the present invention, photoluminescence is plotted as a grayscale with dark regions indicating a higher luminescence intensity, the photoluminescence is plotted as a function of applied bias and wavelength.
FIG. 3(b) is a grayscale plot of the electroluminescence of a photon source of the type described with reference to FIGS. 1 and 2, useful for understanding the present invention, electroluminescence is plotted as a grayscale with dark regions indicating a higher luminescence intensity, the electroluminescence is plotted as a function of applied bias and wavelength.

Typically, the photon source shown in FIGS. 1 and 2 will emit photons from negatively charged exciton states under electrical excitation. This is shown in FIG. 3(b). Negatively charged exciton states are those where the number of electrons in a quantum dot outnumber the number of holes.

FIG. 3(b) shows electroluminescence (EL) from a structure of the type shown in FIGS. 1 and 2 as a function of applied bias across the diode. The dominant emission is from $X^-$ which corresponds to the decay of an exciton having two electrons and a single hole. A visible, but weak contribution from XX which corresponds to decay from a neutral bi-exciton having two electrons and two holes.

FIG. 3(a) shows photoluminescence as a function of applied bias. The photoluminescence from the device shows XX and $X^-$ decay and decay from the neutral X state (a single neutral exciton comprising one electron and one hole) and the $X^+$ state which is a positive exciton comprising two holes and one electron.

Three operating regions as a function of bias across the quantum dot can be seen in FIG. 3(a). The regions are shown separated by dotted lines. The emitting exciton in the quantum dot switches through predominantly positively, neutrally and negatively charged in each of these regions as the bias increases.

This change in charging behaviour of quantum dot is primarily due to tunneling. For the lowest bias region, the electric field across the intrinsic region is strong, which reduces the effective width of the GaAs barriers surrounding the dot, increasing the tunneling rate of carriers out of the dot towards the contacts. Since electrons have smaller effective mass and correspondingly larger wavefunctions, transmission through the barriers becomes highly probable for electrons, thus depopulating the quantum dot of optically excited electrons, resulting in positively charged exciton emission.

For the intermediate bias region, the field is insufficient to promote significant tunneling, and optically excited electrons and holes recombine radiatively to emit neutrally charged exciton and biexciton photons. This is the regime required to generate entangled photon pairs.

For the highest bias region, the profile of the conduction band and valence band approach flat band conditions. Consequently, the energy levels of the electron and hole states in the quantum dot lie below the energy levels of the p and n contacts, and it becomes energetically favourable for the quantum dot to fill with charge, via tunneling from the contacts through the intrinsic GaAs barrier. Again this effect is dominant for electrons due to the lower effective mass, and quantum dots tend to acquire excess negatively charged electrons, which gives rise to negatively charged exciton photon emission after optical excitation.

Thus at biases below that required for current injection across the device, the favoured exciton complex switches to negatively charged. Some neutral XX emission is observed in EL (FIG. 3(b)). This is due to the lack of higher order confined electron states (p-states) in the quantum dots studied, which limits the maximum number of electrons to 2. However, after emitting an XX photon, the dot quickly charges with another electron to form $X^-$.

An embodiment of the present invention is intended for the production of entangled photon pairs using an electrical current. An entangled photon pair is produced if, in a suitable quantum dot, a neutral biexciton decays to the ground state. This cascade decay starting from the decay of XX to X and then the decay of X itself produces an entangled photon pair if the splitting is small. The changing of an XX exciton to an $X^+$ exciton in the lower bias region or the changing of an X exciton to an $X^-$ exciton in the higher bias region will destroy entanglement.

The inventors have realised that if a bi-exciton formed in a quantum dot decays to a neutral exciton, this neutral exciton may become negatively charged before it decays due to an electron tunneling into said quantum dot. Further, a bi-exciton may change to a positive exciton due to the tunneling of electrons out of the quantum dot. Both of these processes prohibit the production of an entangled photon pair from bi-exciton decay. Therefore, by limiting tunneling of electrons or holes into our out of the quantum dot, the neutral charge state of a biexciton or exciton can be preserved for longer. Specifically the rate of charge tunneling at the electric field present during decay of the exciton is less than radiative lifetime of the exciton state in the dot, thus causing the charging of the exciton during an emission cycle to be less likely.

Figure 4:
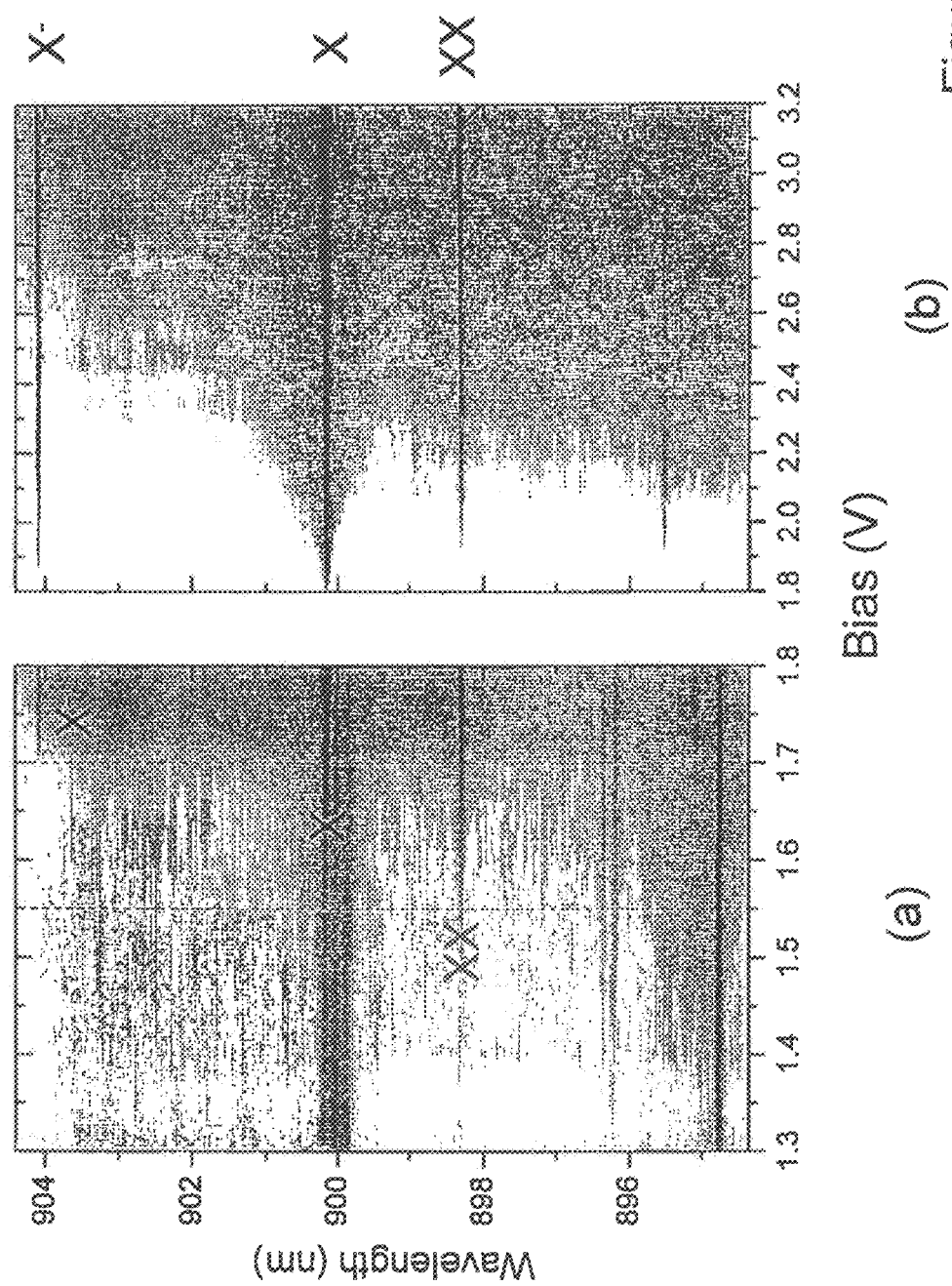
FIG. 4(a) is a grayscale plot of the photoluminescence of a photon source in accordance with an embodiment of the present invention, photoluminescence is plotted as a grayscale with dark regions indicating a higher luminescence intensity, the photoluminescence is plotted as a function of applied bias and wavelength.
FIG. 4(b) is a grayscale plot of the electroluminescence of a photon source in accordance with an embodiment of the present invention, electroluminescence is plotted as a grayscale with dark regions indicating a higher luminescence intensity, the electroluminescence is plotted as a function of applied bias and wavelength.

FIGS. 4(a) and 4(b) show the photoluminescence and electroluminescence respectively of a photon source in accordance with an embodiment of the present invention.

The device used to produce the results shown in FIGS. 4(a) and 4(b) had reduced tunneling between the doped regions of the photon source and the quantum dot. This was achieved by increasing the thickness of the intrinsically doped GaAs barriers surrounding the quantum dot. The cavity thickness was increased to incorporate the thicker layer, and was changed from 1 lambda to 2 lambda (where lambda is the optical distance corresponding to one operating wavelength).

In the range of biases measured, again three regions are seen in the PL spectra of FIG. 4(a). In a similar manner to FIG. 3(a), neutral X and XX emission begins in the second region of bias (>1.55V). At lower biases charge escape through the barrier favours positively charged emission. However, in the third region (>1.7V) although X⁻ emission becomes visible, it is weak in comparison to the 1 lambda cavity device of FIGS. 1 to 3. Crucially, in EL spectra shown in FIG. 4(b), emission is predominantly from the neutral X and XX states, as required to generate entangled photon pairs.

The behaviour in EL is explained as follows. The potential profile of both the valence and conduction band is approximately flat (flat band conditions) allowing injection of electrons from the n doped region towards the p doped region, and of holes in the opposite direction. The electron and hole energy levels of the quantum dot lie below that of the surrounding GaAs barriers, and two electrons and holes relax from the injected current to create the XX state. The XX state decays to emit an XX photon, and leaves the neutral X state behind. Because the barriers are relatively thick, the tunneling time for an electron from the n contact to recharge the dot to X⁻ is longer than the time it takes for the X state to recombine to emit an X photon.

Figure 5:
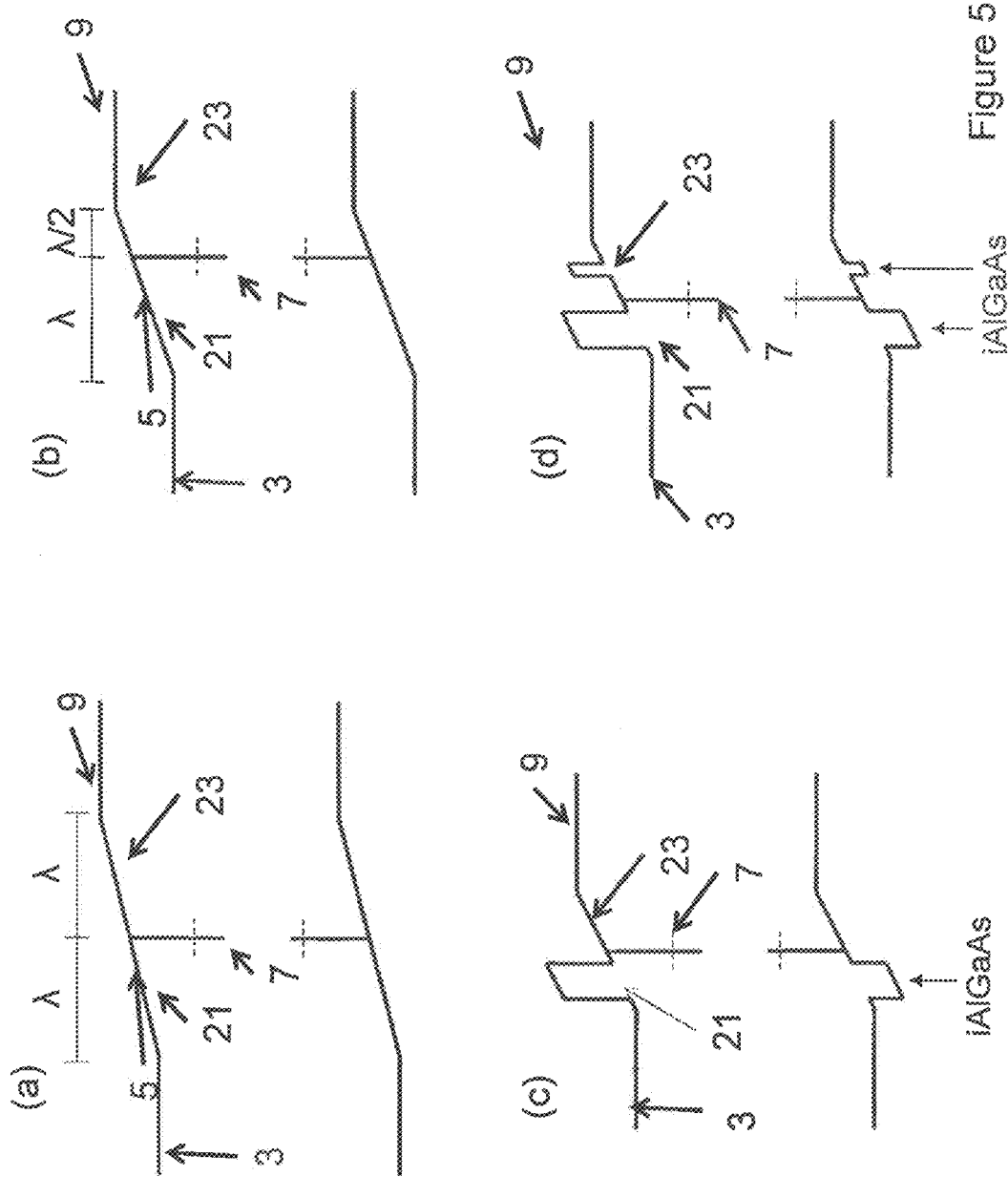
FIG. 5 are schematic electron energy band diagrams for photon source in accordance with an embodiment of the present invention, FIG. 5a has a photon source with an InAs quantum dot formed with a thick 1λ GaAs barrier provided each side of the quantum dot.

There are other barrier designs which can achieve a similar effect, some possible barrier designs are described with reference to FIG. 5. To avoid any unnecessary repetition, like reference numerals will be used to denote like features.

FIG. 5(a) shows a first barrier design as means to create neutrally charged X and XX emission. This version, the total intrinsic region 5 which forms the barrier has been extended to approximately 2 lambda in optical thickness, and was used to obtain the results shown in FIGS. 4(a) and 4(b). In practice the total thickness of the intrinsic region may be slightly less than 2 lambda, as the intrinsic region may be incorporated withing a cavity of thickness 2 lambda, the first and last part of which may be doped. The intrinsic region 5 is divided into a first barrier 21 which is provided between the dot 7 and the n-type region 3 and a second barrier 23 which is formed between the dot 7 and the p-type region 9. The thicker i-GaAs barriers 21, 23 dramatically reduce the tunneling rates, so that the radiative decay time of the X state is shorter than the tunneling time of another electron from the n-region 3 into the dot 7.

FIG. 5(b) shows a second barrier design as means to create neutrally charged X and XX emission. In this example only the first barrier 21 has been extended compared to the reference case of FIGS. 1 and 2 since electron tunneling is the dominant charging mechanism. The second barrier 23 is the same size as that shown in FIGS. 1 and 2.

FIG. 5(c) shows a third barrier design as means to create neutrally charged X and XX emission. In this example the n-side barrier 21 remains to be lambda/2 in thickness, but it's effective height is increased by including an i-AlGaAs region as indicated. The increased barrier will reduce the tunneling probability of electrons from the n-region to the dot. In addition the barrier will also reduce current flow for the same applied bias when compared with the reference case in FIGS. 1 and 2. Efficient injection of carriers into the dot could be increase by higher bias, or by short pulses of current supplied at higher bias.

FIG. 5(d) shows a fourth modified barrier design as means to create neutrally charged X and XX emission. It is similar to that of FIG. 5(c), but additionally includes an AlGaAs region on the p-side barrier of the quantum dot: The height and width of this AlGaAs barrier need not be as large as the n-side AlGaAs region, as hole tunneling is already suppressed relative to electron tunneling due to the larger effective mass of holes. The height of the AlGaAs barrier may be increased thus increasing the aluminum fraction relative to the gallium fraction.

Figure 6:
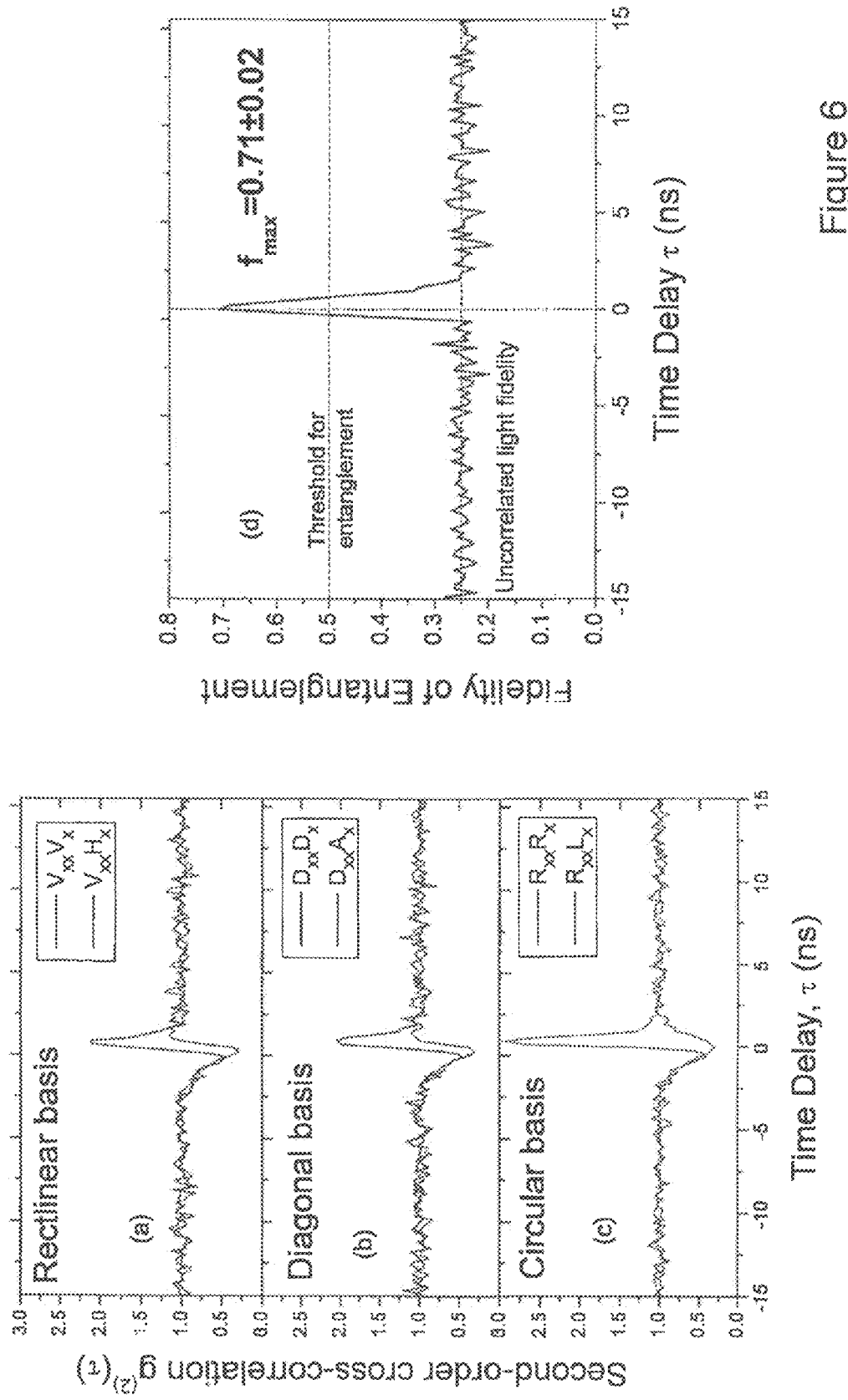
FIG. 6 are plots showing DC measurements of entangled photon pairs from a photon source in accordance with an embodiment of the present invention.

FIG. 6 shows experimental results from a photon source for the general design of FIG. 5(a). The actual device used will be described with reference to FIG. 11.

The sample was cooled to ~6K in a continuous flow He cryostat, and emission collected using a microscope objective lens. The emission was divided using a beam splitter between two spectrometers, which filtered the light corresponding to XX and X emission respectively. A polarising beam splitter divided the X emission into vertically and horizontally polarised components, which were detected using silicon avalanche photo diodes (APDs). A linear polariser oriented vertically filtered the XX emission which was detected by a third APD. The time between detection of an XX photon and that of an X photon in each polarisation combination was measured using a time-amplitude converter and counting electronics.

The sample was driven in dc mode using a current source set to 4 mA. The second order correlation $g^{(2)}$ was measured as a function of the time delay between XX and X photons τ, for photons pairs of the same and opposite polarisation, in each of the polarisation bases linear, diagonal and circular. The linear and diagonal polarisations were selected by setting the angle of a half-wave plate inserted directly after the objective lens to 0° and 22.5° respectively, and the circular basis was selected by replacing the half-wave plate with a quarter-wave plate oriented at 45°. The results of the dc correlation measurements are shown in FIG. 6.

FIGS. 6(a), 6(b) and 6(c) show second order cross-correlation $g^{(2)}$ as a function of time delay between photons in the rectilinear, diagonal and circular polarisation bases respectively. All curves show a dip for negative delays close to τ=0, which reveals suppression in the probability of detecting an X photon just before an XX photon. This is expected as after X emission the quantum dot is always empty, and must capture 2 electrons and 2 holes to emit an XX photon, which takes some time. For positive delays close to τ=0, a strong peak is seen for photons of the same rectilinear and diagonal polarisation, and for photons of opposite circular polarisation. This is expected for entangled photon pair emission, as just after XX photon detection, the quantum dot is in the X state, leading to strong probability of X photon emission and detection. Additionally, the polarisation of this photon depends on the measurement of the first XX photon, as the polarisation states of the two photons are entangled in the state $$\Psi^+ = (|H_{XX}\rangle|H_X\rangle + |V_{XX}\rangle|V_X\rangle)/\sqrt{2}$$

$$= (|D_{XX}\rangle|D_X\rangle + |A_{XX}\rangle|A_X\rangle)/\sqrt{2}$$

$$= (|L_{XX}\rangle|R_X\rangle + |R_{XX}\rangle|L_X\rangle)/\sqrt{2}$$

Here V, H, D, A, L, and R represent vertical, horizontal, diagonal, anti-diagonal, left-hand circular and right-hand circular polarisation of the XX and X photon as denoted by subscripts.

To prove the light emitted by the diode is entangled, the fidelity f⁺ of the detected state to the maximally entangled Bell state $\Psi^+$ is measured, using the following formula.

$$f^+(\tau) = \frac{1}{4}\left(\frac{g_{VV}^{(2)}(\tau) - g_{VH}^{(2)}(\tau)}{g_{VV}^{(2)}(\tau) + g_{VH}^{(2)}(\tau)} + \frac{g_{DD}^{(2)}(\tau) - g_{DA}^{(2)}(\tau)}{g_{DD}^{(2)}(\tau) + g_{DA}^{(2)}(\tau)} - \frac{g_{RR}^{(2)}(\tau) - g_{RL}^{(2)}(\tau)}{g_{RR}^{(2)}(\tau) + g_{RL}^{(2)}(\tau)} + 1\right)$$

The subscripts that identify each correlation measurement in the above equation denote the polarisation of the first and second photon. The equation is valid for unpolarised emission, as observed experimentally.

The fidelity f+ is plotted in FIG. 6(d) as a function of the time delay between the X and XX photon τ. Away from τ~0, f+ is ~0.25, the expected value for uncorrelated light. This is expected as XX and X are not emitted during the same decay cycle. However, close to τ~0, a strong peak is observed showing that photon pairs emitted at the same (or similar) time are entangled. The peak exceeds the value of 0.5 which proves that the emission is entangled. These measurements are the first demonstration of a fully functional entangled light emitting diode (ELED), with measured fidelity f+ up to 0.71±0.02.

Figure 7:
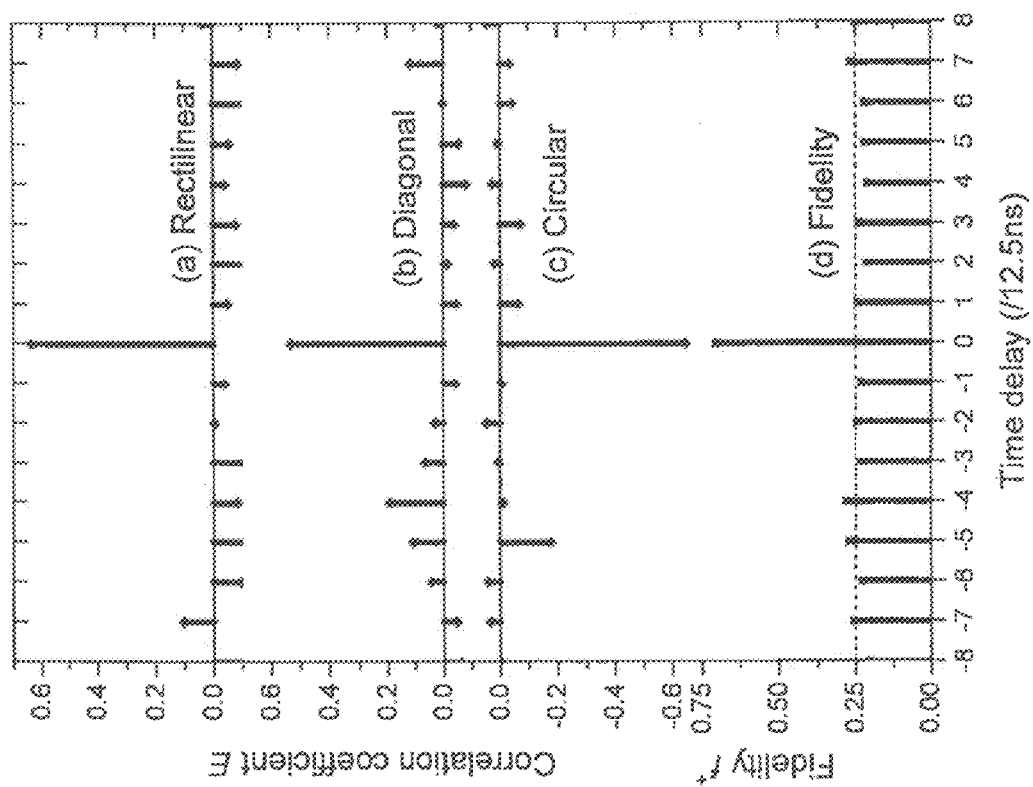
FIG. 7 are AC measurements of entangled photon pair emission from a photon source in accordance with an embodiment of the present invention.

The photon source also works in pulsed mode, which is desirable for applications such as quantum key distribution. The results of such measurements are shown in FIG. 7 for another (similar) device. A dc bias is supplied and combined with a bias-tee with an ac driving signal. The dc voltage is 1.8V, and the ac voltage is nominally 3.3V amplitude square pulses of width 500 ps and period 12.5 ns. A 50 Ohm impedance matching circuit was connected in parallel with the diode.

FIG. 7 shows correlation measurements recorded as described with reference to FIG. 6, except with ac electrical excitation. FIGS. 7(a), 7(b) and 7(c) show the results for rectilinear, diagonal and circular polarisation bases respectively. The degree of polarisation correlation is plotted as a function of the delay between photons in periods. In agreement with the dc case, FIGS. 7(a), 7(b) and 7(c) show that photon pairs emitted during the same decay cycle usually have the same polarisation in the rectilinear and diagonal bases, and opposite polarisation in the circular basis. This is as expected for entangled photon pair emission.

FIG. 7(d) shows the fidelity plotted as a function of delay in periods, similarly to the dc case described above. The fidelity for photon pairs emitted in the same cycle is 0.71, which again exceeds the requirement to prove entanglement.

Not all quantum dots will produce a suitable pair of entangled photons even from cascade decay of a neutral bi-exciton followed by decay of a neutral exciton.

Photon pairs emitted by quantum dots are typically entangled in a time-evolving state, where the phase between the |HH> and |VV> components of the superposed state evolves as a function of the time delay between detection of the first (XX) and second (X) photon. The phase evolution occurs due to different energies of the non-degenerate optically active exciton levels, shown schematically separated by an energy S in FIG. 8(a). The splitting arises due to in-plane asymmetry of the exciton wave functions caused by physical asymmetries such as shape, composition, and strain.

Figure 8:
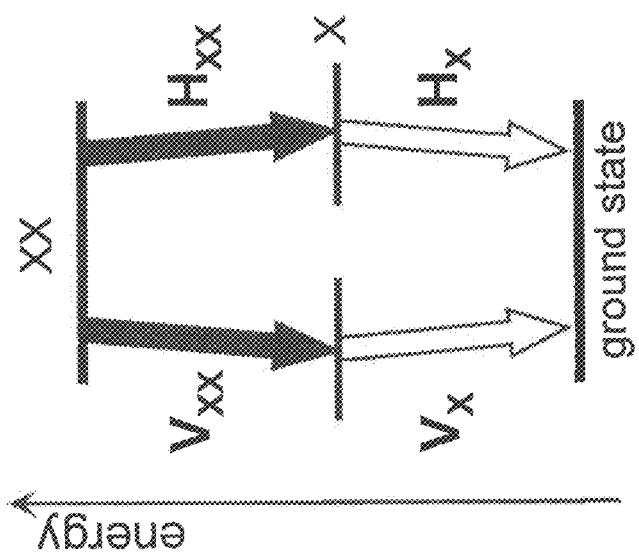
FIG. 8(a) is an energy level diagram of typical quantum dot with polarisation splitting S in the exciton level and FIG. 8(b) is an energy level diagram of quantum dot with zero polarisation splitting.
Figure 8:
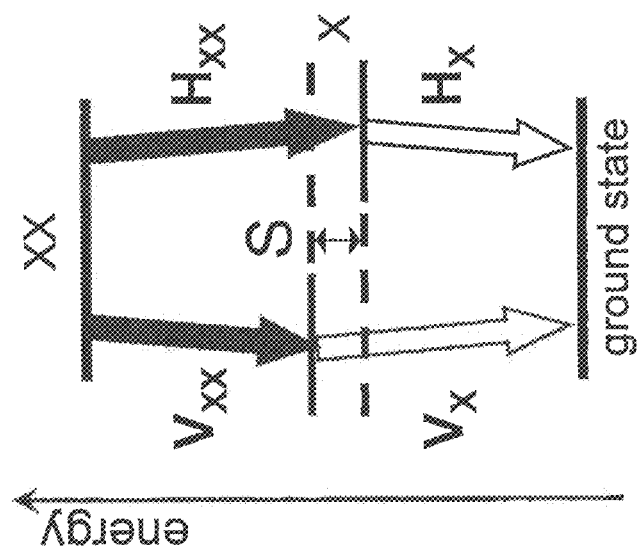

Time-evolving entangled states can be used in a system that additionally measures the time between the photon pairs as well as polarisation of the individual photons. However, averaged over time, the polarisation of photons can be determined by the energy of emission, which are polarisation dependent due to the splitting of the exciton level as shown in FIG. 8(a).

Therefore it is preferred if the photon source comprises quantum dots which have approximately zero polarisation dependent splitting of the optically active exciton level. This case is shown schematically in FIG. 8(b). The smaller the splitting the better, splittings which are equal to or less than the homogeneous linewidth of the emission are preferred. In the quantum dots described herein, this maximum preferred splitting is of the order ~1 μeV, as the radiative lifetime of the exciton state is ~1 ns.

Figure 9:
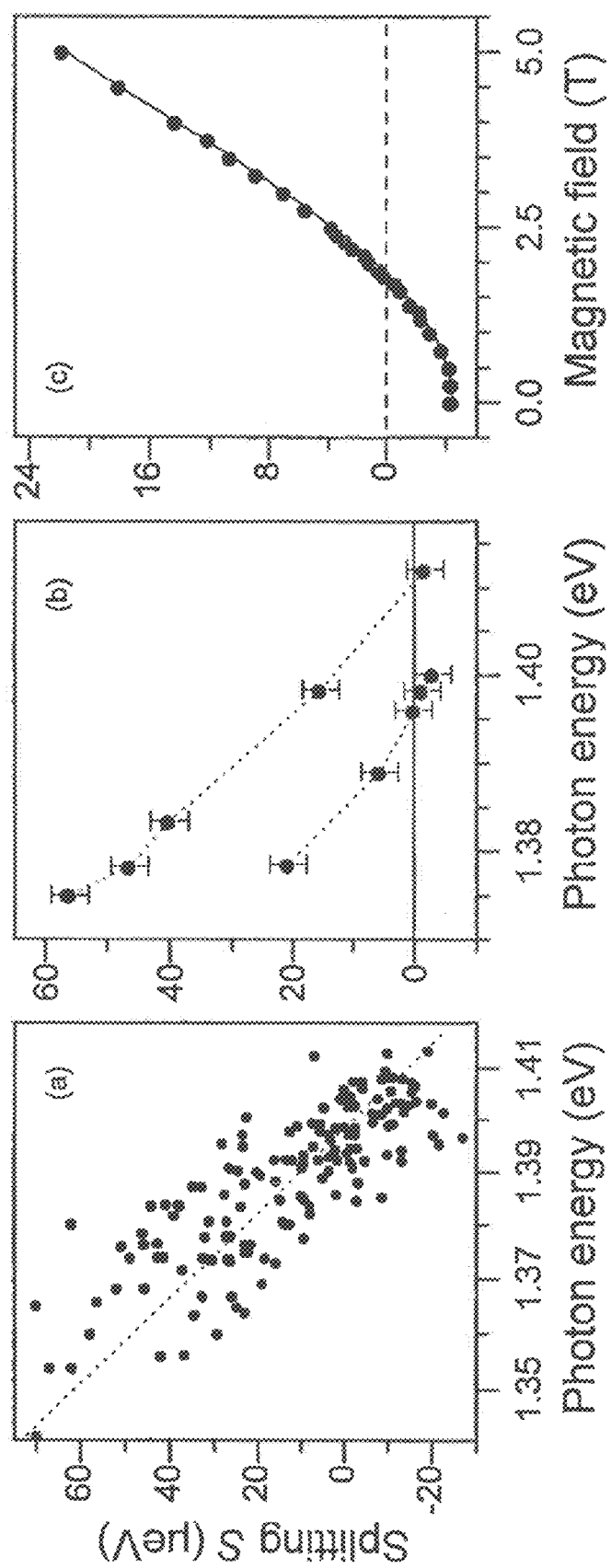
FIG. 9(a) is a plot showing splitting against quantum dot energy for a plurality of grown quantum dots.
FIG. 9(b) shows a plot of splitting against dot energy for two dots which have been annealed in 5 min steps (left to right) at 675° C.
FIG. 9(c) is a plot of splitting for a single dot against in-plane magnetic field.

It has been found that quantum dots with an energy of ~1.4 eV have a small splitting. FIG. 9(a) shows the splitting of quantum dots against photon energy of quantum dots. It is possible to control the conditions under which quantum dots are formed to favour the formation of quantum dots with an energy of ~1.4 eV. Such growth techniques are well known.

A second example of controlling the splitting is shown in FIG. 9(b) which employs annealing to partially dissolve the dot into the surrounding GaAs material, reducing the effective size and thus increasing the emission energy and reducing the splitting to approximately zero. Each point from left to right on each curve represents annealing of the same dot by an additional 5 mins at 675° C. in a rapid thermal annealer. An alternative approach is to heat the device with a focused laser beam.

A third example is shown in FIG. 9(c), which uses an in-plane magnetic field to partially mix optically active and inactive states together. For some quantum dots, such as those emitting >1.4 eV, the mixing is stronger for the lower energy optically active exciton state, meaning the polarisation splitting reduces to zero at ~1.8 T in the example shown.

Application of other fields in other orientations also affects the splitting. The field types include electrical, magnetic and strain, and the directions can be perpendicular, parallel or otherwise oriented to the growth direction.

Figure 10:
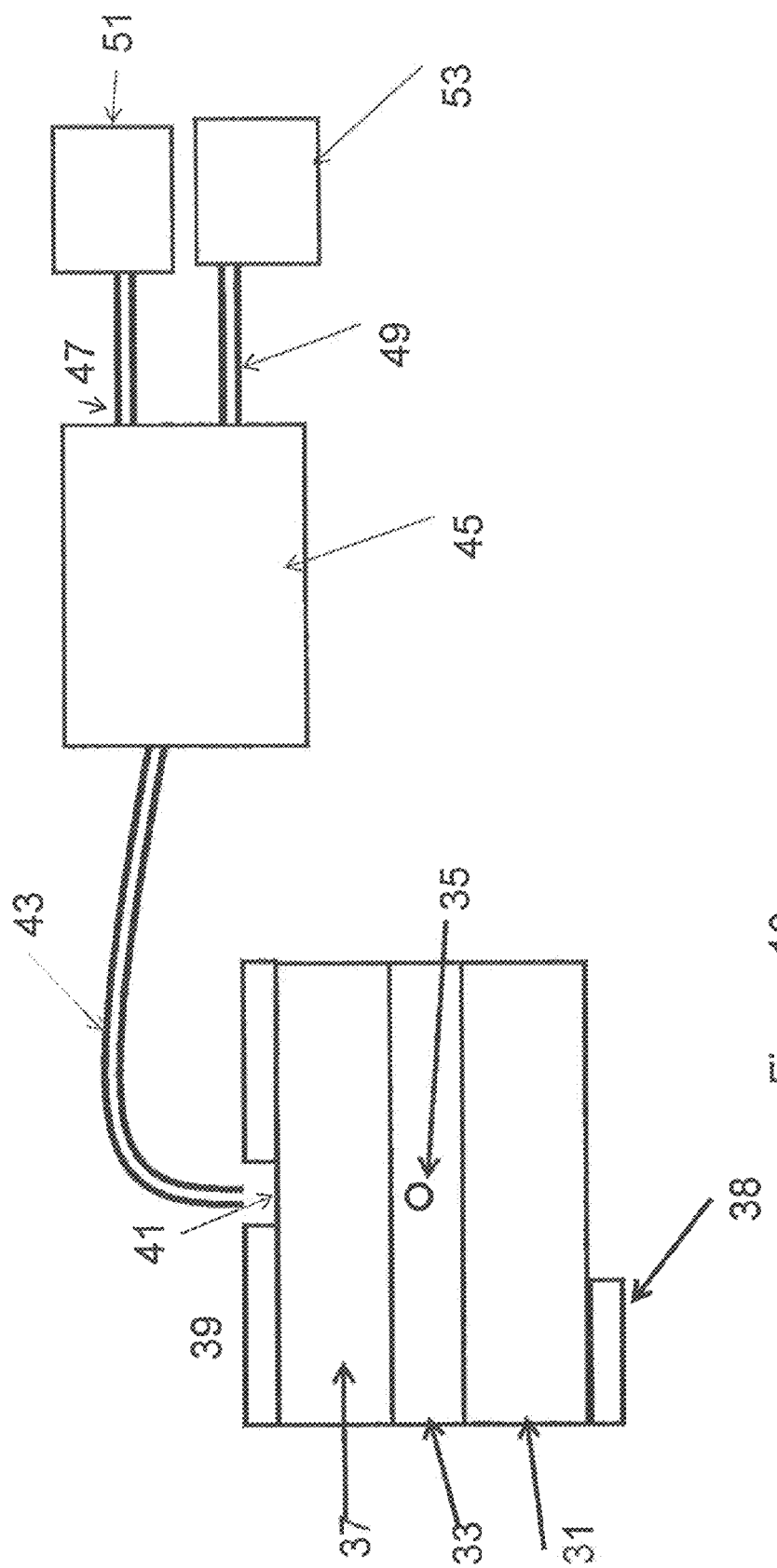
FIG. 10 is a schematic of a photon source in accordance with an embodiment of the present invention.

FIG. 10 is a schematic of a photon source in accordance with an embodiment of the present invention. The layer structure of the photon source can be any of those previously described with reference to FIG. 5. The photon source comprises an n-type region 31, an intrinsic region 33 comprising a quantum dot 35 and a p-type region 37 provided on the opposing side of said intrinsic region 33 to the n-type region 31.

The intrinsic region 33 comprises a barrier structure which limits tunneling. The structure may be any of the devices described with reference to FIG. 5.

Overlying and in contact with said p-type region is a mask 39 defining emission aperture 41. Emission aperture 41 directs radiation into fibre 43. Fibre 43 directs emitted photons into distribution unit 45. Distribution unit 45 is configured to reproducibly distribute each entangled photon pair across two output channels.

In one embodiment, the distribution unit is configured to separate the two photons of the entangled pair based on their energy and direct them out through outputs 47 and 49. This type of arrangement is of use in quantum communication systems. In quantum communication systems based on entangled photons, two parties who wish to communicate each receive a photon from an entangled photon pair. The system of FIG. 10 can be used to produce the entangled pair and then output one photon for directing to one party and the other photon for directing to the other party.

In a further embodiment, the distribution unit is a polarising beam splitter which divides the wavefunctions of an entangled pair of photons. The polarising beam splitter could be used to path entangle the photons for use in quantum imaging or recording/reading data.

In a yet further embodiment, two detectors 51 and 53 will be provided to separately detect the photon arising from the X decay and the photon arising from the XX decay.

Alternatively, a single detector may be provided with photon counting resolution high enough to distinguish between the arrival of a single photon and a photon pair. Such a detector can be used in imaging and reading systems to distinguish between the arrival of an entangled photon pair and a single photon.

In a yet further embodiment, said detectors 51 and 53 are polarising measurement units configured to measure the polarisation of each photon of the entangled pair.

Figure 11:
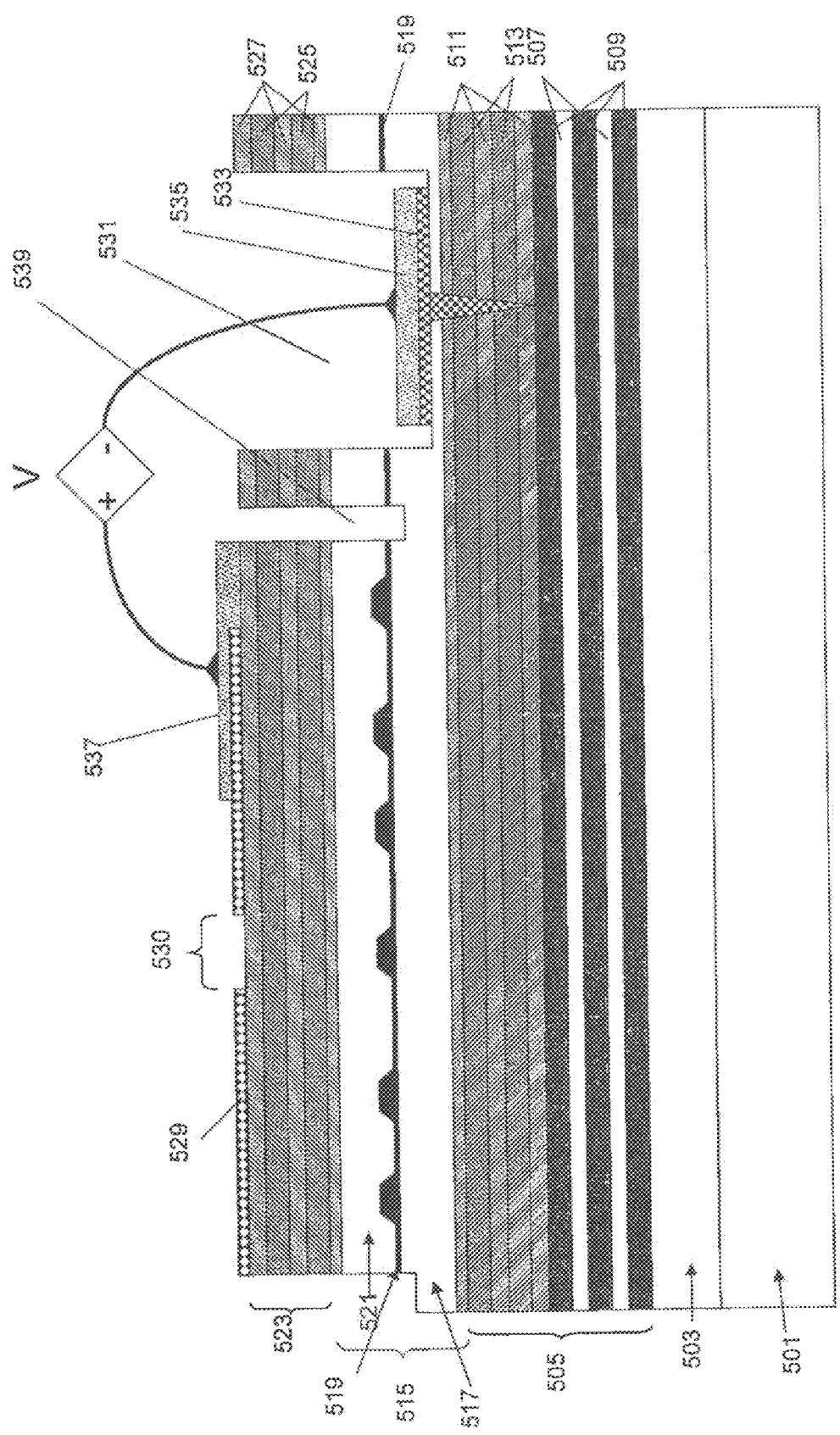
FIG. 11 is a schematic layer structure of a photon source in accordance with an embodiment of the present invention.

FIG. 11 is a detailed layer structure of a photon source in accordance with an embodiment of the present invention. The device was grown by MBE and has the following layer structure. First the bottom distributed Bragg reflector (DBR) 505 was grown on a 500 nm i-GaAs buffer 503 grown on a i-GaAs substrate 501. The bottom DBR consists of 14 repeats of lambda/4 layers of GaAs 507 followed by $Al_{0.98}Ga_{0.02}As$ 509. The top two repeats 511, 513 were doped to be n-type with Si to a density of $1.75 \times 10^{18}$.

Next the cavity region 515 was formed with total optical thickness of 2 lambda as follows. For this example, lambda corresponds to the wavelength of the quantum dot emission of ~885 nm, which is reduced in GaAs due to the higher refractive index. First a 50 nm thick n-GaAs layer 517 doped with Si to a density of $1.75 \times 10^{18}$ was formed, followed by (1lambda-50 nm) of i-GaAs which forms the lower barrier. The temperature was dropped by 130° C., and the dot layer 519 was formed by growth of ~1.6 mL of InAs which self assembles to give a quantum dot density of the order ~1 $\mu m^{-2}$. 10 nm of i-GaAs capped the dots, before the temperature was increased by 115° C. (lambda-10 nm-50 nm) of i-GaAs 521 completes the intrinsic region and upper barrier, followed by 50 nm of p-GaAs doped with C to $10^{18}$, which completes the cavity region.

Finally the top mirror 523 was formed by growth of 2 repeats of lambda/4 layers of $p-Al_{0.98}Ga_{0.02}As$ 525 followed by p-GaAs 527. The p-doping was provided by C at a density of $10^{18}$, except for the final 3 nm which was p+ doped by C to $5.6 \times 10^{19}$.

The device was processed to provide means to isolate emission from a small number of quantum dots, and to provide means to electrically inject carriers into the quantum dots. The completed device is shown schematically in FIG. 11 (not to scale). Processing was performed on ~5×5 mm chips taken from the wafer.

First an aluminum layer 529 containing an array of 100 apertures 530 of diameter ~2 μm was formed using standard photolithography.

Next an n-contact window 531 was formed again using standard photolithography, and an acid etch using 1:8:80 mixture of sulphuric acid, hydrogen peroxide, and water. The etch depth of the window is such that it stops 10-15 nm above the n-doped regions. An n-contact was formed by depositing 80 nm of gold-germanium-nickel 533 in the n-contact window using standard photolithography. The contact was annealed so an Ohmic connection extends downwards from the contact to the n-doped regions. Finally 20 nm titanium followed by 80 nm Au 535 was evaporated on top of the n-contact to form a bonding surface.

The p-contact 537 was formed by evaporation of 20 nm titanium followed by 80 nm gold using standard photolithography.

An isolation etch 539 defined 360×360 μm mesas by etching down through the p-region and dot layer, stopping in the lower i-GaAs barrier. This was achieved by standard photolithography and acid etch as described above.

Finally the device was packaged to provide external electrical contacts, and gold bond wires connected the package contacts to the chip contacts.

In the structure of FIG. 11, an InAs quantum dot layer lies at the centre of a 2λ cavity, with a distributed Bragg reflector (DBR) below, and shorter DBR above to form an unbalanced microcavity to increase emission intensity in the upward direction. Emission from a single quantum dot (QD) is isolated by an aperture in a metal mask. The top DBR is p-doped along with the top part of the cavity, and the top of the bottom DBR is n-doped along with the bottom part of the cavity, to form a p-i-n junction. Electrical contacts allow a bias V to be applied across the undoped intrinsic region incorporating the QD.

To improve the collection efficiency of emitted photons by the device, it is preferable to incorporate the active region of the LED device within an optical microcavity.

The structure described with reference to FIG. 11 has an optical microcavity which is a planar microcavity, formed by a cavity region of width mλ/2n where λ is similar to the wavelength of the emitted photons, n is the refractive index of the cavity material, and m is an integer. The cavity region is enclosed between two distributed Bragg reflectors (DBRs) formed of multiple repeats of alternating layers of high and low refractive index materials with thickness λ/4n.

Figure 12:
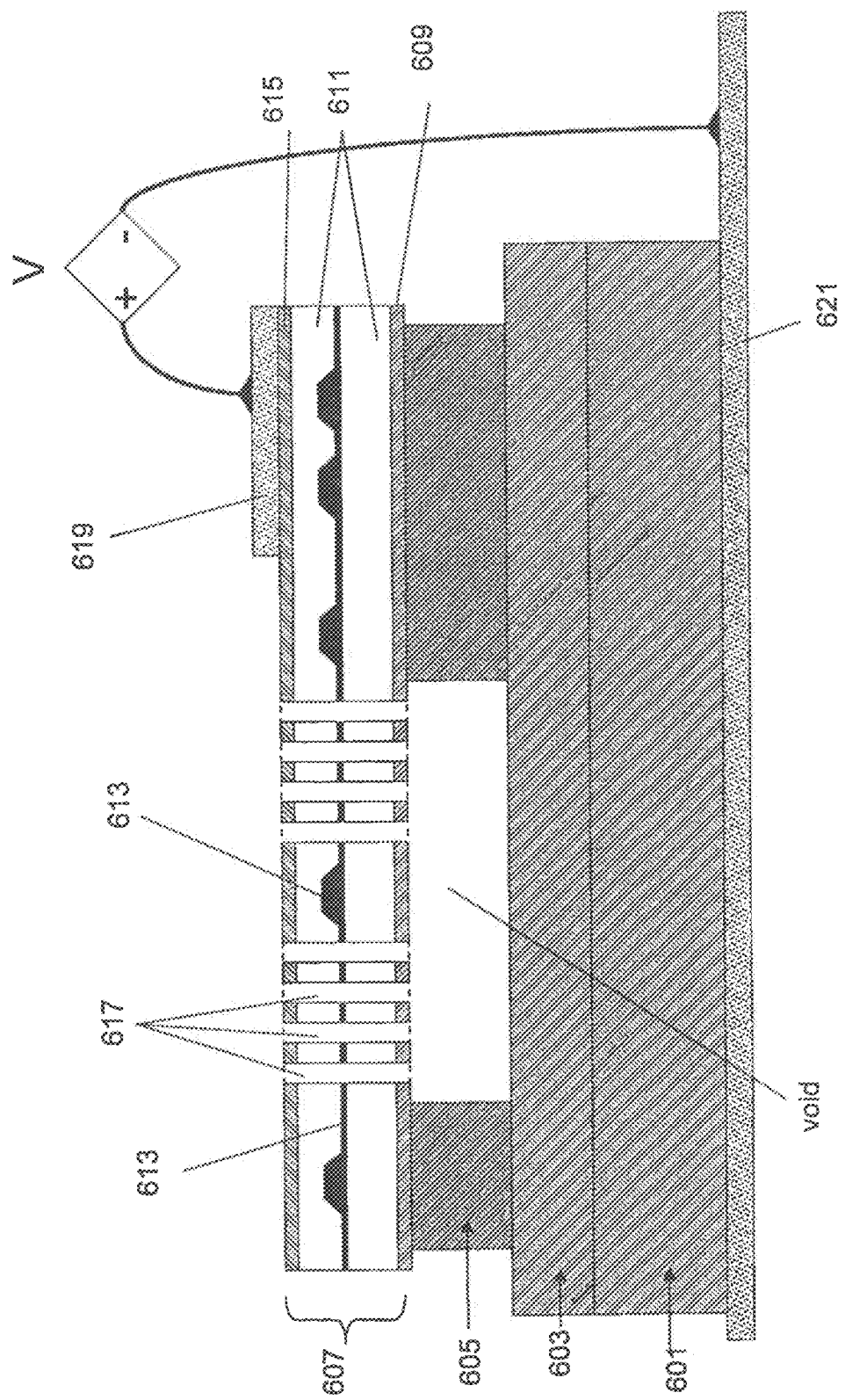
FIG. 12 is a schematic layer structure of a photon source in accordance with a further embodiment of the present invention.

The structure of FIG. 12 has a photonic crystal nanocavity. The photonic crystal nanocavity comprises a high refractive index waveguide region, with thickness comparable to the wavelength of the emitted light, perforated by a periodic array of holes containing a low index material. The periodicity is on a length scale comparable to the wavelength of the emitted light. The array of holes includes a nanocavity region, which is a defect of one or more holes either absent, of different size or displacement with respect to the periodic lattice.

The layer structure is grown by MBE and comprises (from bottom to top) of an n-type GaAs substrate 601 followed by 500 nm n-GaAs buffer 603. An $n-Al_xGa_{1-x}As$ sacrificial layer 605 is then deposited, of actual thickness (as opposed to optical thickness) ~λ. The waveguide region 607 follows next, beginning with 50 nm n-GaAs 609 followed by (lambda-100 nm) i-GaAs 611, with an InAs quantum dot layer 613 at the centre (fabricated similarly to described in FIG. 3). 50 nm of p-GaAs 615 completes the waveguide region and growth of the device.

The grown wafer is cut into 5×5 mm squares and processed into LEDs as follows. First a photonic crystal pattern is written onto e-beam resist using standard e-beam lithography. Photonic crystal patterns are now widely understood, and consist of typically triangular arrays of holes of diameter ~100 nm separated by lengths comparable to the wavelength of light, ~250 nm. Missing, displaced, or differently sized holes form the nano cavity region, which in this example is a single missing hole.

The pattern written in e-beam resist is transferred to the waveguide by standard reactive ion etching techniques, to etch holes 617 at least as deep as the waveguide, and stopping before the bottom of the sacrificial layer 605.

The e-beam resist is removed and standard photolithography and evaporation used to deposit Ti—Au p contacts 619. A second photolithography stage is then employed to provide an isolation etch, which should extend through at least the p-GaAs layer 615, and in the example shown, down to the bottom of the sacrificial layer.

The sacrificial layer is then removed under the waveguide using a selective etch which etches AlGaAs strongly compared to GaAs. The device is then packaged onto a conducting carrier 621, and bonds are made between the package contacts and the p-contacts of the diode.

The entangled light source may be made using any semiconductor system, applying the design rules described here. Suitable semiconductors include AlAs, GaAs, InAs, InP, GaN AlN and alloys thereof.

The optimal wavelength to achieve small polarisation splitting and/or optimum dot density is likely to be different in each material system, so cavity designs such as the example presented here must be adjusted accordingly. The barrier thicknesses and heights should be increased so that the tunneling time of charge from the contacts exceeds the radiative lifetime of the exciton state.

Figure 13:
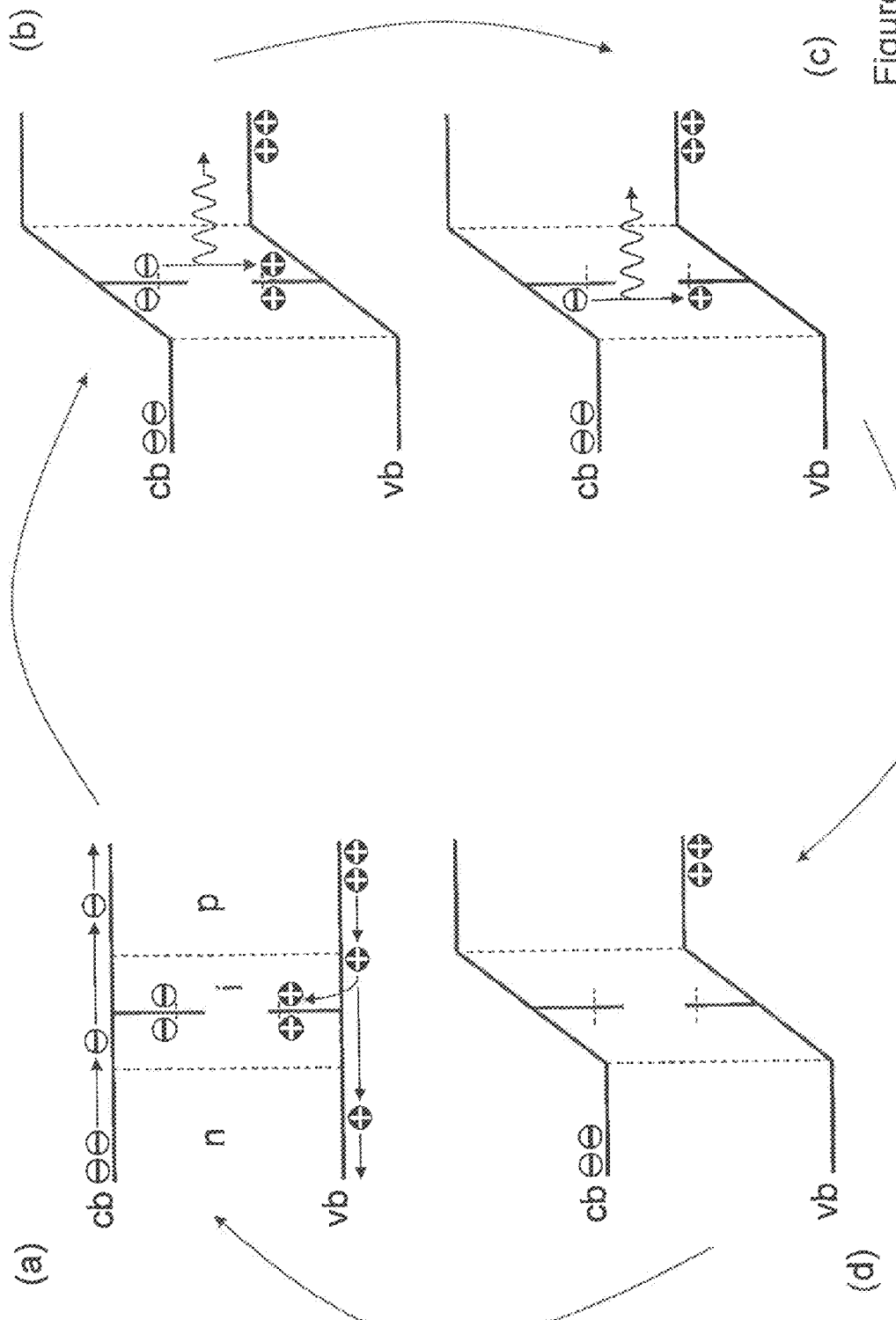
FIGS. 13(a) to 13(d) are schematic band diagrams illustrating a possible mode of operation of a device in accordance with an embodiment of the present invention.

A mode in operation in accordance with an embodiment will now be explained with reference to FIG. 13.

FIG. 13(a) shows the a device similar to that in FIG. 5(a), with an applied forward bias between the p and n contacts equal to the built in voltage of approximately 1.5V. Under these conditions, the conduction and valence band profiles are approximately flat, and electrons and holes are injected across the intrinsic region as shown. Some of the carriers relax into the dot to form the neutrally charged XX state. This 'injection' voltage should be applied for a time that is short compared to the XX radiative decay time to avoid re-excitation of the biexciton state after XX photon emission. The time should therefore be typically <=500 ps.

The bias is then reduced to a 'recombination' voltage as shown in FIG. 13(b). This bias corresponds to a neutrally charged regime where electron tunneling out of the dot is weak (as the electric field is not very strong) and the tunneling time of an electron from the n-region is long compared to the radiative lifetime, due to the $e_1$ level of the quantum dot being comparable or higher than the Fermi level in the n-region. For the quantum dot device shown in FIG. 5, a suitable recombination voltage would be ~1.45V. Recombination of a first electron and a first hole will emit a single XX photon as shown, and create the X state.

FIG. 13(c) shows the X state in the device whilst the bias remains at the 'recombination' voltage. As the bias was chosen to optimize neutral X emission, the electron and hole recombine radiatively before capture or escape of further electrons. This means two photons have been emitted at the 'recombination' voltage by neutrally charged XX and X excitons, to create and entangled photon pair.

FIG. 13(d) shows the empty quantum dot following decay of the X state at the recombination voltage. No further charging of the dot takes place until the next emission cycle, which begins with a voltage pulse to reinstate the 'injection' voltage across the device as shown in (a).

Figure 14:
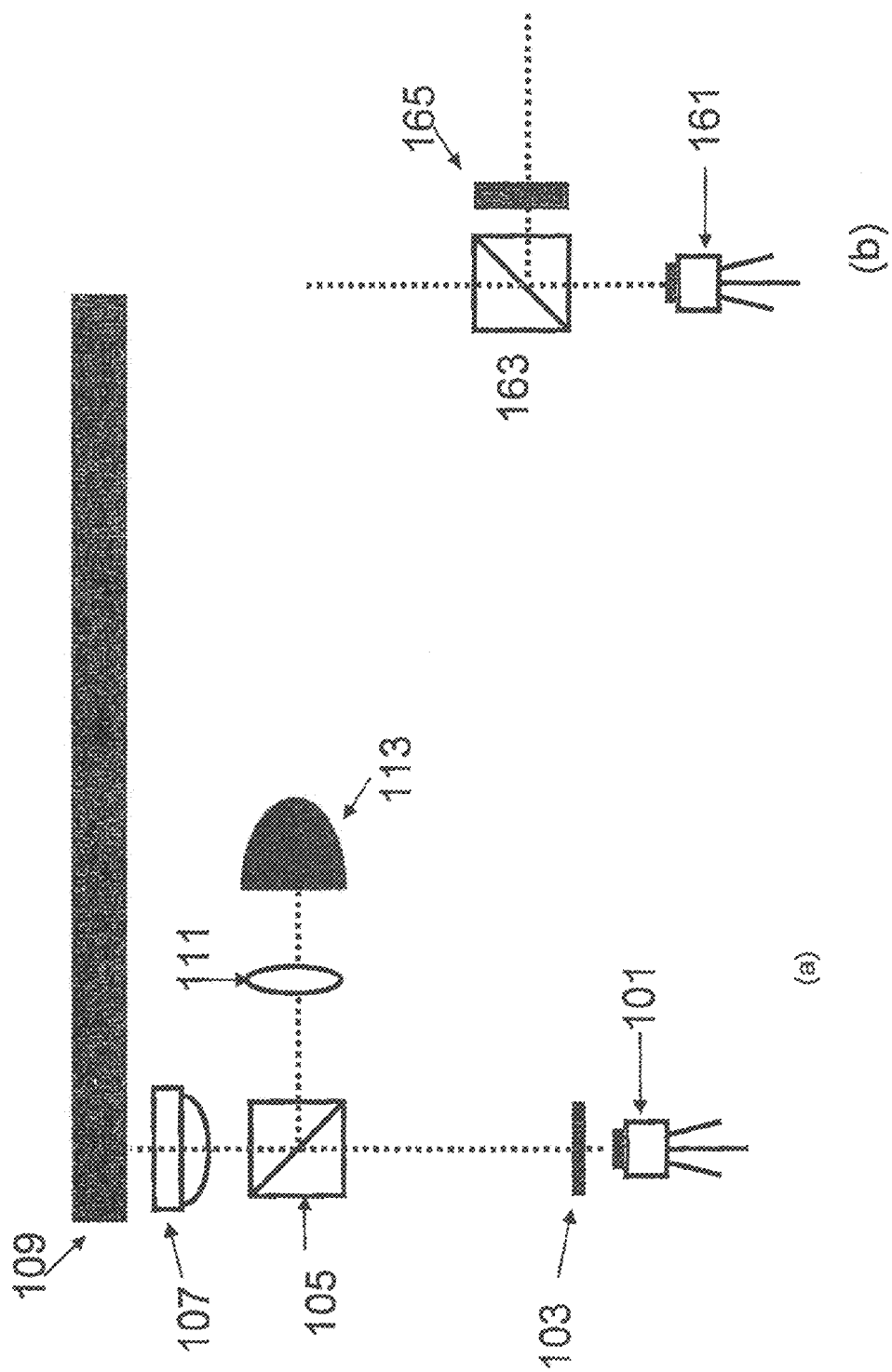
FIG. 14 is a schematic of an optical recorder in accordance with an embodiment of the present invention.

FIG. 14(a) is a schematic of an optical read system using an entangled photon source in accordance with an embodiment of the present invention in accordance with an embodiment of the present invention. The source 101 initially outputs polarisation entangled photons which are then converted to path entangled photons with the same polarisation.

The polarisation entangled photons can be converted to path entangled photons using a system similar to that shown in FIG. 14b. The photon source produce pairs of polarization entangled photons with identical linear polarization (either horizontal [H] or vertical [V]) into a superposed state, and this polarization is undefined until one of the photons is measured.

In FIG. 14b, a source 161 of polarisation entangled photons emits a pair or photons to polarising beam splitter 163. Both photons exit the same port, either 1 or 2. Thus the final state is a superposition of having 2 photons exit port 1 and follow a first path, or 2 photons exit port 2 and follow a second path. A half wave plate 165 rotates the polarisation of photons exiting port 2, which can allow interference as now all photons are the same linear polarization.

Returning to FIG. 14b, once the photons have been path entangled, filter 103 filters out all frequencies except those of the entangled photons.

The path entangled photons then enter polarisation beam splitter 105 which passes the entangled photons through to lens 107. Lens 107 then focuses the path entangled photons onto to the data storage medium 109. The photons are reflected back into lens 107, then into polarising beam splitter 105. Due to reflection from the data storage medium 109, the polarisation of the reflected photons has changed and hence the photons are this time reflected by beam splitter 105 into lens 111 and finally though to photon detector 113. The polarising beam splitter 105 may be replaced by a non-polarising beam splitter. The system will work in the same way, but will this time use non-deterministic transmission and reflection at the beam splitter.

The data storage medium has a pattern which is made of pits and lands which are used to encode data on the recording medium. For example, the pits being used to encode bit "0" and the non-pitted areas or "lands" being used to denote bit "1". In this embodiment, the data storage medium is a disk. However, other formats for optical storage may also be used.

The data storage medium 109 may be configured such that the pits pierce into a less reflective substance and hence the reflected signal from the pits is considerably lower than the reflected signal from the lands. Thus the probability of a photon pair being reflected by a land is considerably higher than that of a photon pair being reflected by a pit. Thus, by monitoring the photon pair count at the detector 113 it is possible to distinguish between a pit and a land or bit 0 and bit 1.

The photon detector is a multiphoton detector which can distinguish the number of photons being received. If the source outputs an entangled photon pair then the photon detector is capable of distinguishing between 1 and 2 photons. Thus, it can determine if it has detected a stray photon or if it has detected a photon pair which has arisen from reflection from the recording medium.

In general, the resolution of such a system is enhanced, because the properties of entangled photons pairs (and more generally multi-photons) are partially equivalent to single photons with double (or more generally multiple) the energy. Thus an entangled photon source operating at 800 nm can generate 2-photon interference with effective wavelength of 400 nm. Such an enhancement is similar to that achieved by changing the laser from standard DVD, to the higher capacity HD DVD, for example. Alternatively an entangled pair source operating at 400 nm can generate interference with an effective wavelength of 200 nm, enabling an increase in optical data storage capacity. Such a system is described in more detail in GB 2451803.

Figure 15:
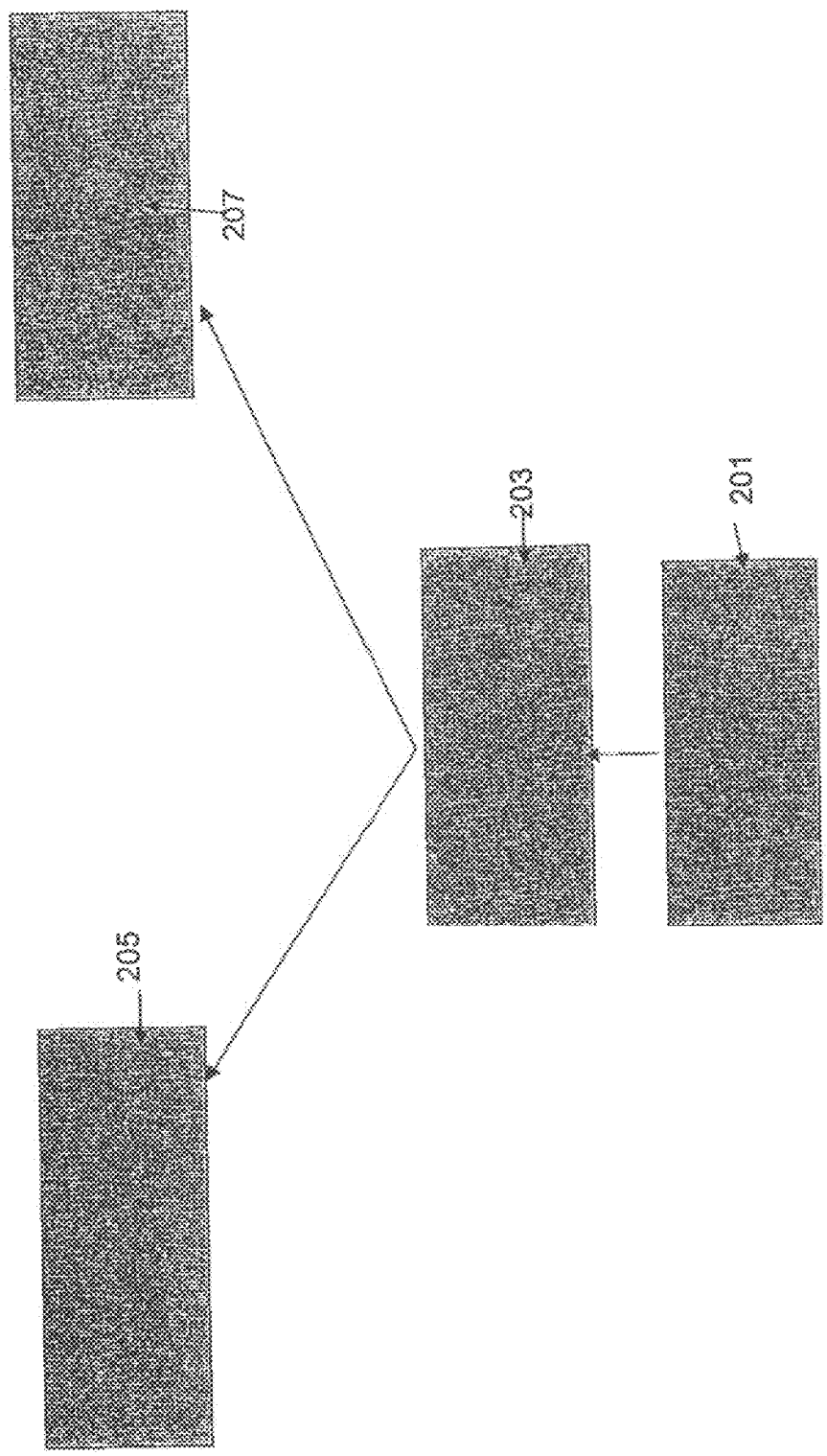
FIG. 15 is a schematic of a quantum communication system in accordance with an embodiment of the present invention.

Entangled photon sources are also used in quantum communication systems of the types shown schematically in FIG. 15. Here, entangled photon source 201 which is a source of the type described above produces an entangled photon pair. The photons are then passed into separator unit 203. Separator unit will separate the photon pair and direct one photon to the first receiver 205 and the second photon to the second receiver 207. Though each measurement outcome is random, performing a measurement on the photon received at the first receiver will affect the state of the photon received at the second receiver 207 (and vice-versa). Therefore, in conjunction with a classical communication channel it is possible for the first 205 and second 207 receivers to communicate securely using the system of FIG. 15.

Figure 16:
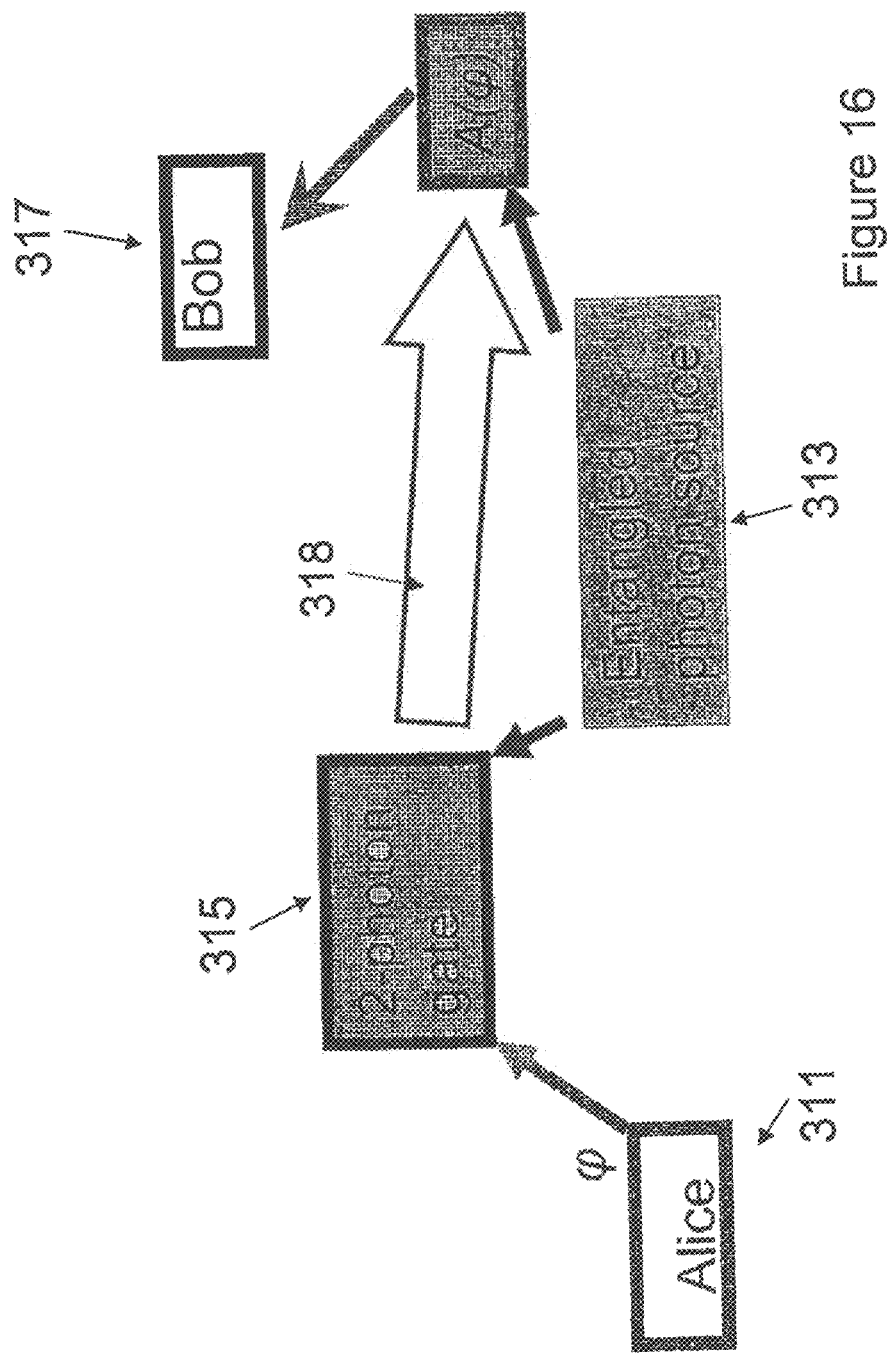
FIG. 16 is a schematic of quantum repeater in accordance with an embodiment of the present invention.

In quantum communication systems, there is a challenge to communicating information across large distances. To address this problem, the use of quantum repeaters has been suggested. FIG. 16 shows a quantum repeater using an entangled photon source in accordance with an embodiment of the present invention to send a message from a sender (Alice) 311 to a receiver (Bob) 317.

In this example the quantum repeater operation requires a 2 photon gate 315, an entangled photon source 313 and a classical channel 318.

The sender Alice 311 has a single photon source. A second photon source which is an entangled photon source 313 in accordance with an embodiment of the present invention produces an entangled pair of photons. It is necessary that one of the photons from the entangled photon source 313 sent to the 2-photon gate 215 is identical to the photon emitted by Alice 311. The other photon of the entangled pair generated by 313 is sent to bob 317. The identical photons are then passed to two-photon gate 315 which performs a measurement which compares them. Based on the result of this measurement classical information can be transmitted to Bob via a channel 318. Bob uses this information to perform a transformation (A($\phi$)) on the photon the entangled photon source sent to him, thus converting its quantum state to be the same as the initial photon generated by Alice. In this manner, the photon which reached Bob 317 contains the quantum information sent by Alice, and this information has been transmitted over a larger distance than would have been possible had Alice sent her photon directly.

While certain embodiments have been described, these embodiments have been presented by way of example only, and are not intended to limit the scope of the inventions. Indeed, the novel sources, and methods described herein may be embodied in a variety of other forms; furthermore, various omissions, substitutions and changes in the form of the sources, and methods described herein may be made without departing from the spirit of the inventions. The accompanying claims and their equivalents are intended to cover such forms or modifications as would fall within the scope and spirit of the inventions.

The invention claimed is:

1. A photon source comprising: a quantum dot; electrical contacts configured to apply an electric field across said quantum dot: and an electrical source coupled to said contacts, said electrical source being configured to apply a first voltage at which electrons and holes are injected into said quantum dot to form a bi-exciton or higher order exciton, and a second voltage at which injection of electrons and holes is stopped, wherein said photon source further comprises a barrier configured to increase the time which an electron or hole takes to tunnel to or from said quantum dot to be greater than the radiative lifetime of an exciton in the quantum dot when the second voltage is applied, the quantum dot being suitable for emission of entangled pairs of photons during decay of a bi-exciton or higher order exciton.

2. A photon source according to claim 1, wherein said barrier is provided as a layer between said quantum dot and said electrical contact, the thickness of said layer is at least 150 nm.

3. A photon source according to claim 1, further comprising a distribution unit configured to reproducibly distribute each entangled photon pair across two output channels.

4. A photon source according to claim 3, wherein said distribution unit is configured to separate said photons on the basis of their energy or time emitted from source.

5. A photon source according to claim 3, wherein said distribution unit is configured to divide the wavefunctions of an entangled pair of photons.

6. A photon source according to claim 5, wherein said distribution unit comprises a polarising beam splitter.

7. A photon source according to claim 3, wherein said distribution unit is configured to entangle said entangled photons with respect to a further property, said further properties being selected from path entanglement or phase entanglement.

8. A photon source according to claim 1, further comprising first and second detectors configured to separately detect each photon of said entangled pairs.

9. A photon source according to claim 1, further comprising a detector configured to distinguish between the arrival of a single photon and a photon pair.

10. A photon source according to claim 1, further comprising an optical cavity.

11. A photon source according to claim 10, wherein said optical cavity is selected from a planar cavity or a photonic crystal cavity.

12. A photon source according to claim 1, wherein the energy difference between the optically active exciton levels of different polarisations in the quantum dot are equal to or less than the homogenous line-width of the emission from the quantum dot.

13. A photon source according to claim 1, wherein the energy difference between the optically active exciton levels of different polarisations in the quantum dot are equal to or less than 2 $\mu$eV.

14. A photon source according to claim 1, wherein said quantum dot is subjected to a field which acts to reduce non-degeneracy in the exciton energy levels of said quantum dot, said field being selected from an electric field, magnetic field or strain field.

15. A photon source according to claim 1, wherein said second voltage is set to minimise tunneling of electrons and holes from the contacts to the quantum dot.

16. A method of operating a photon source, said photon source comprising:
a quantum dot; electrical contacts configured to apply an electric field across said quantum dot; and an electrical source coupled to said contacts, said electrical source being configured to apply a potential such that electrons and holes are supplied to said quantum dot to form a bi-exciton or higher order exciton, wherein said photon source further comprises a barrier configured to increase the time which an electron or hole takes to tunnel to and from said quantum dot to be greater than the radiative lifetime of an exciton in the quantum dot, the quantum dot being suitable for emission of entangled photons during decay of a bi-exciton or higher order exciton;
said method comprising:
switching said electrical source between two voltages, a first voltage being configured to allow injection of electrons and holes into said quantum dot and a second voltage wherein said injection of electrons and holes is stopped and tunneling of electrons and holes to and from the quantum dot is minimised.

17. A method of fabricating a photon source; said method comprising:
forming an n-type semiconductor region;
forming a p-type semiconductor region;
forming a quantum dot in a semiconductor structure between said n and p-type semiconductor regions;
forming a barrier between said n-type region and said quantum dot,
providing electrical contacts to said n and p-type semiconductor region,
said quantum dot being configured such that when a first voltage is applied across said electrical contacts, electrons and hole are injected into said quantum dot and when a second voltage is applied across said electrical contacts, said injection of electrons and holes is stopped, said barrier being configured to increase the time which an electron takes to tunnel to or from said quantum dot to be greater than the radiative lifetime of an exciton formed in the quantum dot when said second voltage is applied, wherein said quantum dot is configured to be suitable for emission of entangled photons during decay of a bi-exciton or higher order exciton.

18. A method according to claim 17, wherein configuring said quantum dot comprises selecting growth parameters of said quantum dot to provide a dot with a degenerate exciton energy level.

19. A method according to claim 17, wherein configuring said quantum dot comprises annealing said quantum dot after formation of said quantum dot to provide a dot with a degenerate exciton energy level.

* * * * *